(12) United States Patent
Kim

(10) Patent No.: US 9,830,986 B2
(45) Date of Patent: Nov. 28, 2017

(54) ELECTRONIC DEVICE HAVING INCREASED READ MARGIN BY COMPENSATING FOR SNEAK CURRENT AND OPERATING METHOD THEREOF

(71) Applicant: SK hynix Inc., Icheon (KR)

(72) Inventor: Hyun-Sik Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 196 days.

(21) Appl. No.: 14/678,889

(22) Filed: Apr. 3, 2015

(65) Prior Publication Data

US 2016/0180928 A1 Jun. 23, 2016

(30) Foreign Application Priority Data

Dec. 18, 2014 (KR) .......................... 10-2014-0183310

(51) Int. Cl.
| | | |
|---|---|---|
| G11C 11/00 | (2006.01) | |
| G11C 13/00 | (2006.01) | |
| G11C 7/06 | (2006.01) | |
| G11C 11/16 | (2006.01) | |
| G11C 29/50 | (2006.01) | |

(52) U.S. Cl.
CPC ............ G11C 13/004 (2013.01); G11C 7/067 (2013.01); G11C 11/1673 (2013.01); G11C 13/0033 (2013.01); G11C 29/50008 (2013.01); G11C 11/1697 (2013.01); G11C 13/0038 (2013.01); G11C 2207/063 (2013.01)

(58) Field of Classification Search
None
See application file for complete search history.

(56) References Cited

U.S. PATENT DOCUMENTS

| | | | | |
|---|---|---|---|---|
| 6,222,421 B1* | 4/2001 | Kiyose | ................. | H03L 7/0895 |
| | | | | 327/156 |
| 2005/0276138 A1* | 12/2005 | Inoue | ...................... | G11C 8/08 |
| | | | | 365/210.1 |
| 2010/0118595 A1* | 5/2010 | Bae | ........................ | G11C 5/145 |
| | | | | 365/148 |
| 2012/0113737 A1* | 5/2012 | Lee | ........................ | G11C 5/147 |
| | | | | 365/226 |
| 2014/0119094 A1* | 5/2014 | Lee | ...................... | G11C 13/004 |
| | | | | 365/148 |

FOREIGN PATENT DOCUMENTS

| | | |
|---|---|---|
| KR | 10-0587694 B1 | 6/2006 |
| KR | 10-0610014 B1 | 8/2006 |

* cited by examiner

*Primary Examiner* — Khamdan Alrobaie
*Assistant Examiner* — Sultana Begum

(57) ABSTRACT

An electronic device includes a semiconductor memory unit. The semiconductor memory unit may include a cell array suitable for including a plurality of resistive memory cells which are arranged in a plurality of column lines and a plurality of rows lines, and a read circuit. The read circuit is suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts.

26 Claims, 13 Drawing Sheets

ELECTRONIC DEVICE HAVING INCREASED READ MARGIN BY COMPENSATING FOR SNEAK CURRENT AND OPERATING METHOD THEREOF

CROSS-REFERENCE TO RELATED APPLICATIONS

The present application claims priority of Korean Patent Application No. 10-2014-0183310, filed on Dec. 18, 2014, which is incorporated herein by reference in its entirety.

BACKGROUND

1. Field

Exemplary embodiments of the present invention relate to memory circuits or devices, and applications thereof in electronic devices.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices, for example, an resistive random access memory (RRAM), a phase-change random access memory (PRAM), an ferroelectric random access memory (FRAM), a magnetic random access memory (MRAM), an E-fuse, etc., which can store data using a characteristic that they are switched between different resistance states according to a voltage or current applied thereto.

SUMMARY

Various embodiments are directed to provide an electronic device having an increased read margin by compensating for sneak current and performing a read operation.

Also, various embodiments are directed to provide an electronic device which does not cause delay of a read speed by previously storing information for compensation for sneak current.

In an embodiment, an electronic device may include a semiconductor memory unit.

The semiconductor memory unit may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node, wherein the bias information is determined and stored in the semiconductor memory unit before the read operation starts.

Each of the plurality of resistive memory cells may include: a variable resistance element suitable for having a high resistance state or a low resistance state according to a logic value of data stored in the variable resistance element; and a selection element coupled in series to the variable resistance element.

Each of the plurality of resistive memory cells may be coupled to a corresponding column line among the plurality of column lines and a corresponding row line among the plurality of row lines.

The read circuit may include: a first current generating unit suitable for generating and supplying a reference current to the sensing node; a second current generating unit suitable for storing the bias information, and generating and supplying a compensation current to the sensing node according to the bias information; a sensing unit suitable for sensing the data of the selected memory cell using the voltage level at the sensing node; and a read voltage driving unit suitable for receiving the bias current from the sensing node and applying the read current to the selected column line.

The bias current may be a sum of the reference current and the compensation current.

The first and second current generating units may generate the bias current having an amount that leads to a maximum read margin in the cell array.

The second current generating unit may include: a storage suitable for storing the bias information; a voltage generating unit suitable for generating a compensation voltage having a level corresponding to the bias information; and a current generating unit suitable for generating the compensation current having an amount corresponding to the level of the compensation voltage.

The bias information may indicate an amount of the bias current that leads to a maximum read margin in the cell array.

The storage may include a plurality of nonvolatile memory elements storing the bias information.

The read voltage driving unit may include: an internal node coupled to the selected column line in the read operation; a comparator suitable for comparing a read voltage with a voltage at the internal node; and a transistor coupled to and disposed between the sensing node and the internal node, and suitable for being controlled by a comparison result of the comparator to apply the read current to the selected column line.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In an embodiment, an electronic device may include a semiconductor memory unit.

The semiconductor memory unit may include: a plurality of cell arrays, wherein each cell array includes a plurality of resistive memory cells which are arranged in a plurality of column lines and a plurality of row lines; and a plurality of read circuits each suitable for, in a read operation, generating a bias current based on bias information, supplying the bias current to a sensing node when a corresponding cell array is selected from the plurality of cell arrays, supplying a read current from the sensing node to a column line selected from among the plurality of column lines, and sensing data stored in a selected memory cell coupled to the selected column line using a voltage level at the sensing node, wherein the bias information is determined and stored in the semiconductor memory unit before the read operation starts.

Each of the plurality of resistive memory cells may include: a variable resistance element suitable for having a high resistance state or a low resistance state according to a logic value of data stored in the variable resistance element; and a selection element coupled in series to the variable resistance element.

Each of the plurality of resistive memory cells may be coupled to a corresponding column line among the plurality of column lines and a corresponding row line among the plurality of row lines.

Each of the plurality of read circuits may include: a first current generating unit suitable for generating and supplying a reference current to the sensing node; a second current generating unit suitable for storing the bias information, and generating and supplying a compensation current to the sensing node according to the bias information; a data sensing unit suitable for sensing the data of the selected memory cell by comparing a voltage level at the sensing node with a voltage level of a reference voltage; and a read voltage driving unit suitable for receiving the bias current from the sensing node and applying the read current to the selected column line.

The bias current may be a sum of the reference current and the compensation current.

The first and second current generating units may generate the bias current having an amount that leads to a maximum read margin in the selected cell array.

The second current generating unit may include: a storage suitable for storing the bias information; a voltage generating unit suitable for generating a compensation voltage having a level corresponding to the bias information; and a current generating unit suitable for generating the compensation current having an amount corresponding to the level of the compensation voltage.

The bias information may indicate an amount of the bias current that leads to a maximum read margin in the selected cell array among the plurality of cell arrays.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In an embodiment, an operating method for an electronic device comprising a semiconductor memory unit may include: detecting an amount of a first bias current that leads to a maximum read margin in the cell array by performing a plurality of read operations while changing the amount of the first bias current; storing bias information indicative of the detected amount of the first bias current; generating, in a read operation, a second bias current based on the stored bias information and supplying the second bias current to a sensing node; supplying a read current from the sensing node to the selected column line in response to a read voltage; and sensing data stored in a selected memory cell among the plurality of memory cells based on a voltage level at the sensing node.

The semiconductor memory unit may include a cell array including a plurality of resistive memory cells which are arranged in a plurality of column lines and a plurality of row lines.

The second bias current may have an amount that leads to a maximum read margin in the cell array.

The generating the second bias current may include: generating a reference current that is substantially constant; and generating a compensation current that varies depending on the bias information, wherein the second bias current is a sum of the reference current and the compensation current.

The generating the compensation current may include: generating a plurality of voltages using a power supply voltage and a plurality of resistors, the plurality of resistors coupled in series to each other; selecting one of the plurality of voltages in response to a plurality of selection signals; outputting the selected voltage as a compensation voltage; and generating the compensation current in response to the compensation voltage.

The selection signals may be selectively activated based on the bias information. The compensation current may have an amount that is inversely proportional to a level of the compensation voltage.

DETAILED DESCRIPTION

Figure 1:
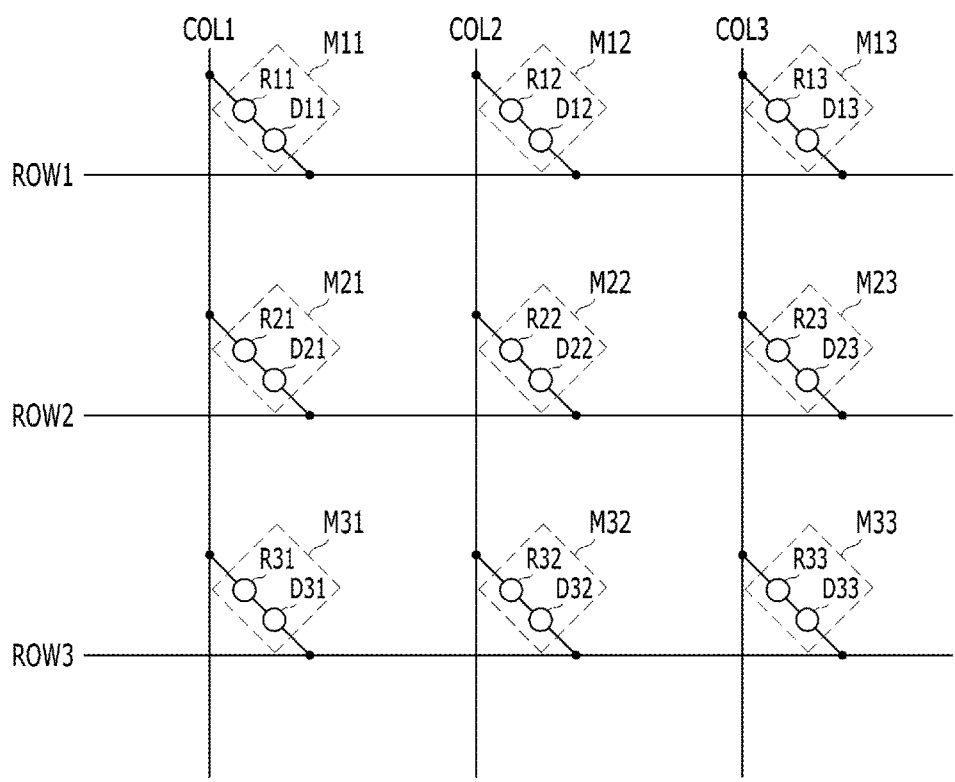
FIG. 1 illustrates a cell array structure of a conventional resistive memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A resistive memory device may be configured to include a memory cell array having a cross-point array structure. In the cross-point array structure, a plurality of bottom electrodes (e.g. a plurality of row lines) and a plurality of top electrodes (e.g. a plurality of column lines) cross each other. In the cross-point array structure, a memory cell, which includes a variable resistance element and a selection element connected to the variable resistance element in series, is disposed at each of crossing points of the bottom and top electrodes.

FIG. 1 illustrates a cell array structure of a conventional resistive memory device.

Referring to FIG. 1, the cell array structure includes a plurality of row lines ROW1-ROW3 (or referred to as word lines), a plurality of column lines COL1-COL3 (or referred to as bit lines), and memory cells M11-M33 disposed at crossing points of the plurality of row lines ROW1-ROW3 and the plurality of column lines COL1-COL3. Each of the memory cells M11-M33 includes a corresponding one of selection elements D11-D33 and a corresponding one of variable resistance elements R11-R33 that are connected in series to each other. Each of the variable resistance elements R11-R33 may have a high resistance state or a low resistance state according to a logic value of data stored therein. The selection elements D11-D33 may be implemented with diodes.

Figure 2:
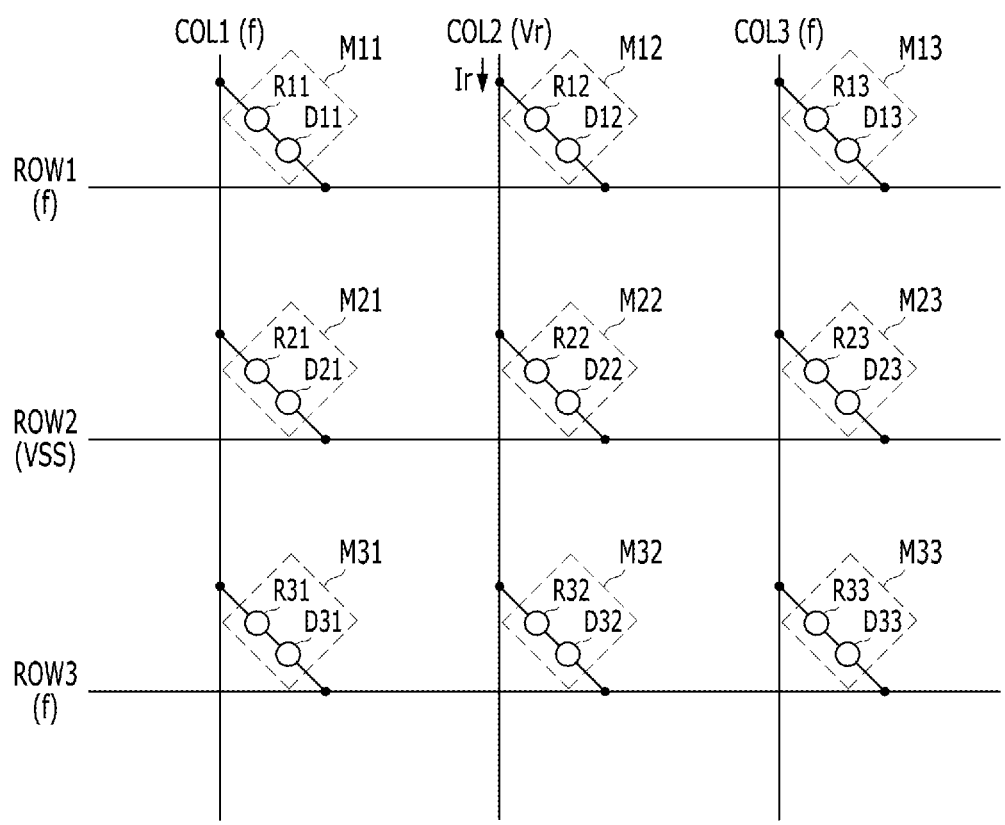
FIG. 2 illustrates an operation to read data stored in the memory cell M22 of FIG. 1.

FIG. 2 illustrates an operation to read data stored in the memory cell M22 of FIG. 1.

Referring to FIG. 2, a ground voltage VSS is applied to the selected row line ROW2 coupled to the selected memory cell M22, while non-selected row lines ROW1 and ROW3 are floated (hereinafter, a floated line will be indicated as "f" in related figures). In addition, a read voltage Vr is applied to the selected column line COL2 coupled to the selected memory cell M22, while non-selected column lines COL1 and COL3 are floated.

A voltage corresponding to the read voltage Vr is applied to both terminals of the selected memory cell M22, while one or both terminals of the non-selected memory cells M11, M12, M13, M21, M23, M31, M32 and M33 are floated. As a result, a current path is formed from the selected column line COL2 to the selected row line ROW2 through the selected memory cell M22, and a read current Ir flows through the selected memory cell M22. When the variable resistance element R22 of the selected memory cell M22 is in a high resistance state, the amount of the read current Ir is small. In contrast, when the variable resistance element R22 is in a low resistance state, the amount of the read current Ir is greater compared to that when the variable resistance element R22 is in the high resistance state. Therefore, data stored in the selected memory cell M22 can be read by sensing the amount of the read current Ir.

Figure 3:
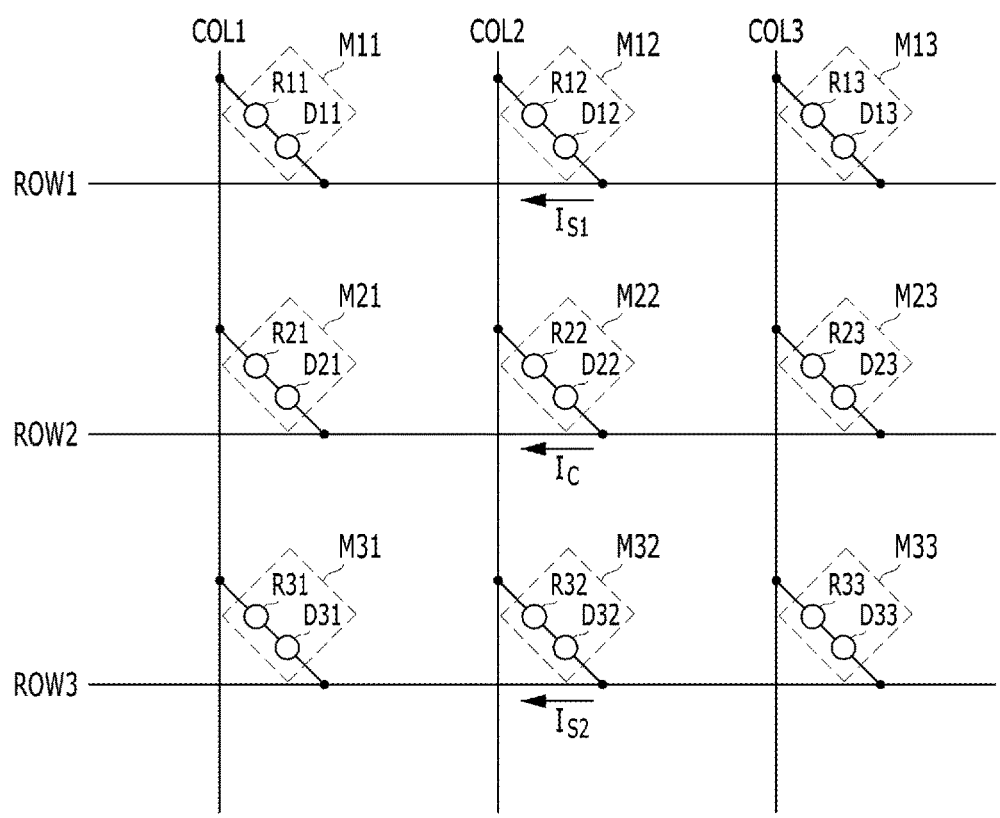
FIG. 3 illustrates an issue related to a sneak current when data stored in the memory cell M22 of FIG. 1 is read.

FIG. 3 illustrates an issue related to a sneak current when data stored in the memory cell M22 of FIG. 1 is read.

When data stored in the selected memory cell M22 is read, a ground voltage VSS is applied to a selected row line ROW2 and a read voltage Vr is applied to a selected column line COL2, while other row lines ROW1 and ROW3 and column lines COL1 and COL3 are floated. During the read operation, a memory current Ic flows from the selected column line COL2 to the selected row line ROW2 through the selected memory cell M22. In addition, first and second sneak current $I_{S1}$ and $I_{S2}$ may flow from the selected column line COL2 to the non-selected row lines ROW1 and ROW3, respectively. Since these sneak current $I_{S1}$ and $I_{S2}$ may render the amount of the current Ic different from that of the read current Ir of FIG. 2, a read margin may be reduced, as will be described below in more detail.

Figure 4:
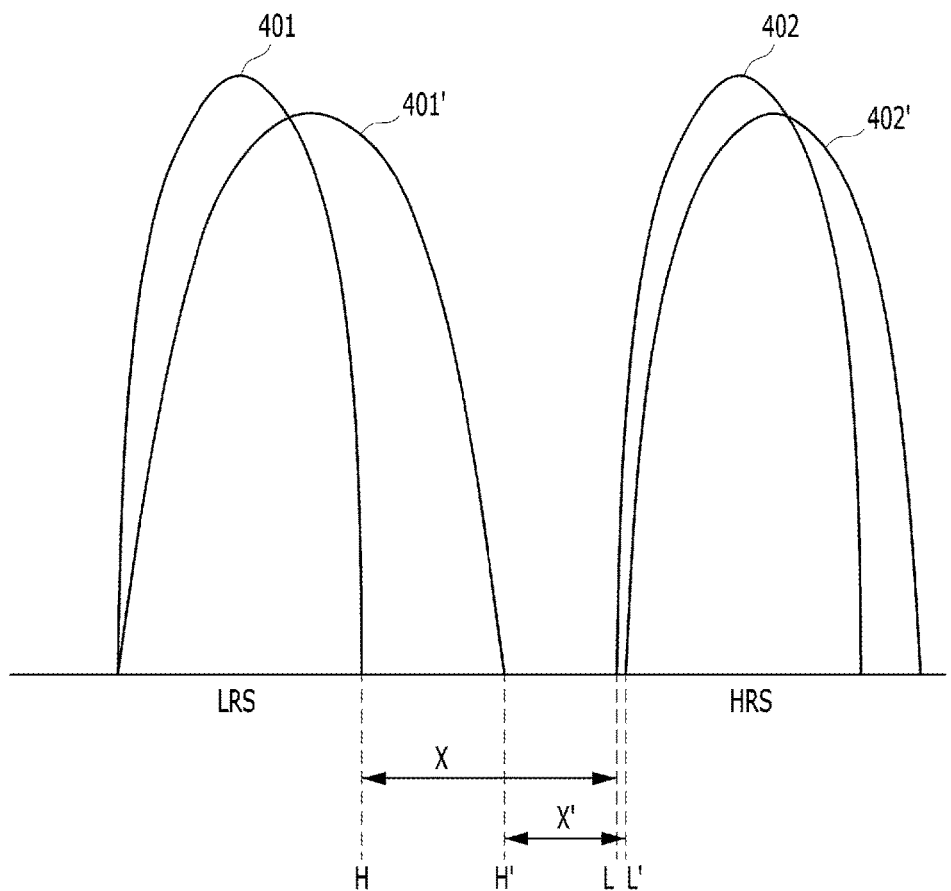
FIG. 4 illustrates a difference in read margins of a resistive memory between when a sneak current occurs and when a sneak current does not occur.

FIG. 4 illustrates a difference between a read margin X' of a resistive memory device when a sneak current occurs and a read margin X when the sneak current does not occur. The horizontal axis of FIG. 4 represents resistance values of a plurality of memory cells, and the vertical axis of FIG. 4 represents a number of memory cells having corresponding resistance values.

Reference number 401 and 402 designate a low-resistance-state distribution LRS and a high-resistance-state distribution HRS when the sneak current does not occur, respectively. Reference number 401' and 402' designate a low-resistance-state distribution LRS and a high-resistance-state distribution HRS when the sneak current occurs, respectively. Here, the read margin X corresponds to a difference between the highest point H of the low-resistance-state distribution 401 and the lowest point L of the high-resistance-state distribution 402 when the sneak current does not occur. The read margin X' corresponds to a difference between the highest point H' of the low-resistance-state distribution 401' and the lowest point L' of the high-resistance-state distribution 402' when the sneak current occurs.

Referring to FIG. 4, the low-resistance-state distribution 401' and the high-resistance-state distribution 402' when the sneak current occurs have ranges wider than those of the low-resistance-state distribution 401 and the high-resistance-state distribution 402 when the sneak current does not occur. Such a tendency is more noticeable in the low-resistance-state distributions 401 and 401' than in the high-resistance-state distributions 402 and 402'. Accordingly, the read margin X' when the sneak current occurs may be smaller than the read margin X when the sneak current does not occur.

Figure 5:
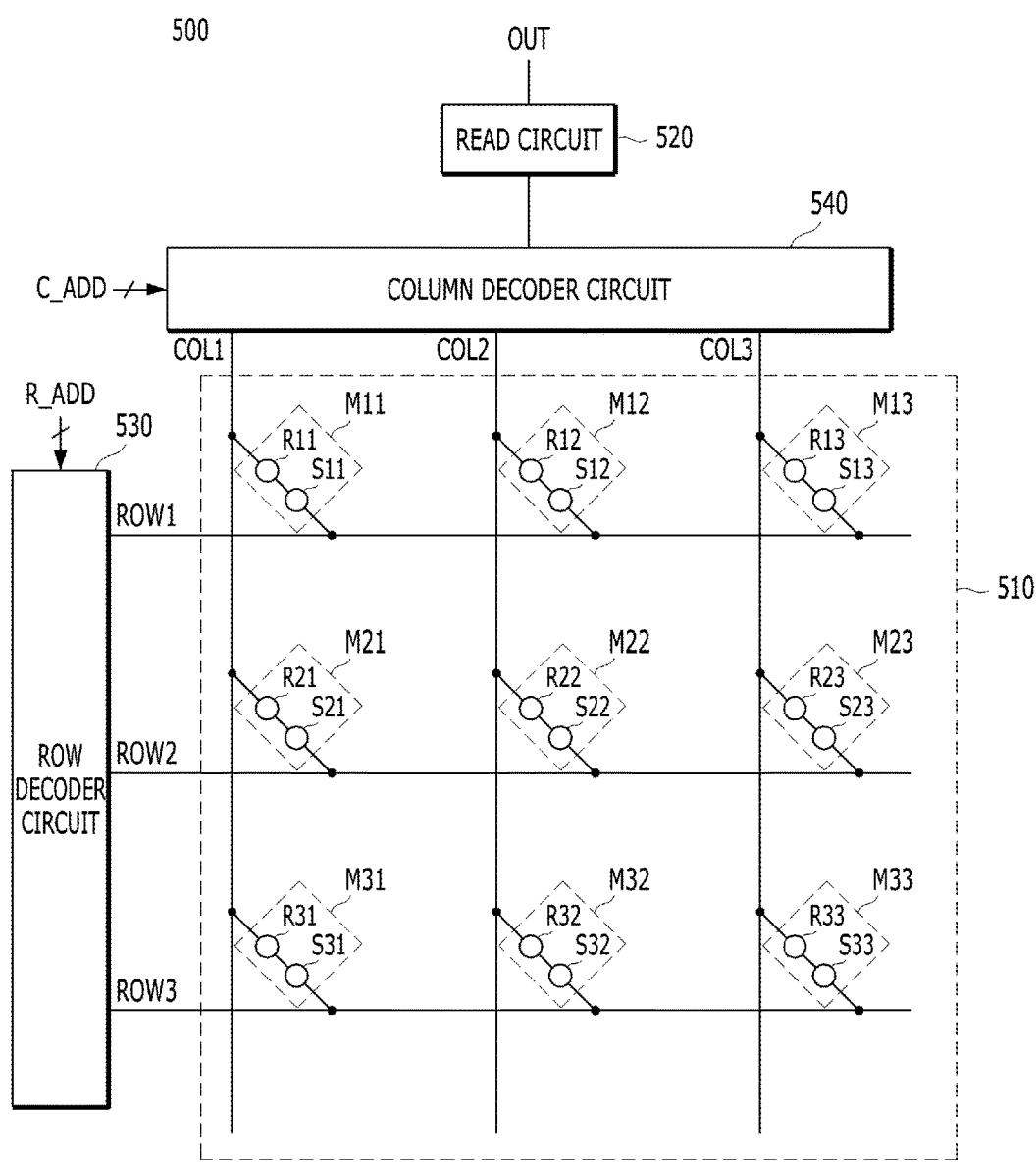
FIG. 5 illustrates a semiconductor memory device in accordance with an embodiment of the present disclosure.

FIG. 5 illustrates a semiconductor memory unit (circuit or device) 500 in accordance with an embodiment of the present disclosure.

Referring to FIG. 5, the semiconductor memory unit (circuit or device) 500 may include a cell array 510, a read circuit 520, a row decoder circuit 530, and a column decoder circuit 540.

The cell array 510 may include a plurality of column lines COL1-COL3 (or referred to as bit lines), a plurality of row lines ROW1-ROW3 (or referred to as word lines), and memory cells M11-M33 formed at crossing points of the row lines ROW1-ROW3 and the column lines COL1-COL3. For convenience of description, FIG. 5 shows the cell array 510 configured with 3 rows and 3 columns, but embodiments are not limited thereto. In another embodiment, the cell array 510 may be configured with tens of rows and tens of columns or hundreds of rows and hundreds of columns.

Each of the memory cells M11-M33 may include a corresponding one of variable resistance elements R11-R33 and a corresponding one of selection devices S11-S33 connected in series to the variable resistance elements R11-R33, respectively. Each of the variable resistance elements R11-R33 is in a low resistance state (or referred to as a set state) when storing first data having a logic low value (e.g., data "0"), or is in a high resistance state (or referred to as a reset state) when storing second data having a logic high value (e.g. data "1"). The selection devices S11-S33 may be implemented with ovonic threshold switch (OTS) elements. FIG. 5 shows the memory cells M11-M33 in which the selection devices S11-S33 are disposed over the row lines ROW1-ROW3 and the variable resistance elements R11-R33 are disposed between the selection devices S11-S33 and the column lines COL1-COL3. However, embodiments are not limited thereto. In an embodiment, the variable resistance elements R11-R33 are disposed over the row lines ROW1-ROW3, and the selection devices S11-S33 are disposed between the variable resistance elements R11-R33 and the column lines COL1-COL3.

The row decoder circuit 530 selects a row line corresponding to a row address R_ADD and does not select other row lines among the row lines ROW1-ROW3, thereby applying a ground voltage to the selected row line, and causing the non-selected row lines to be floated. The column decoder circuit 540 selects a column line corresponding to a column address C_ADD among the column lines COL1-COL3, thereby electrically connecting the selected column line to the read circuit 520, and causing the non-selected column lines to be floated.

The read circuit 520 reads data stored in a selected memory cell, i.e. a memory cell coupled to the selected column line and the selected row line, among the memory cells M11-M33. The read circuit 520 applies a read voltage Vr across both terminals of the selected memory cell to read and output data of the selected memory cell.

In an embodiment, in order to compensate for a sneak current flowing through non-selected memory cells as described above with reference to FIG. 3, the read circuit 520 can provide a bias current to the cell array 510. In an embodiment, a bias current is controlled in a test or calibration operation so that the read circuit 520 may be configured to detect the amount of the bias current that leads to the largest read margin of a tested or calibrated cell array, and to store information corresponding to the detected amount of the bias current. In a read operation subsequent to the test or calibration operation, the read circuit 520 may use the pre-stored information to generate a bias current that has the amount corresponding to the pre-stored information. The configuration and operation of the read circuit 520 will be described below in detail with reference to FIG. 6.

Figure 6:
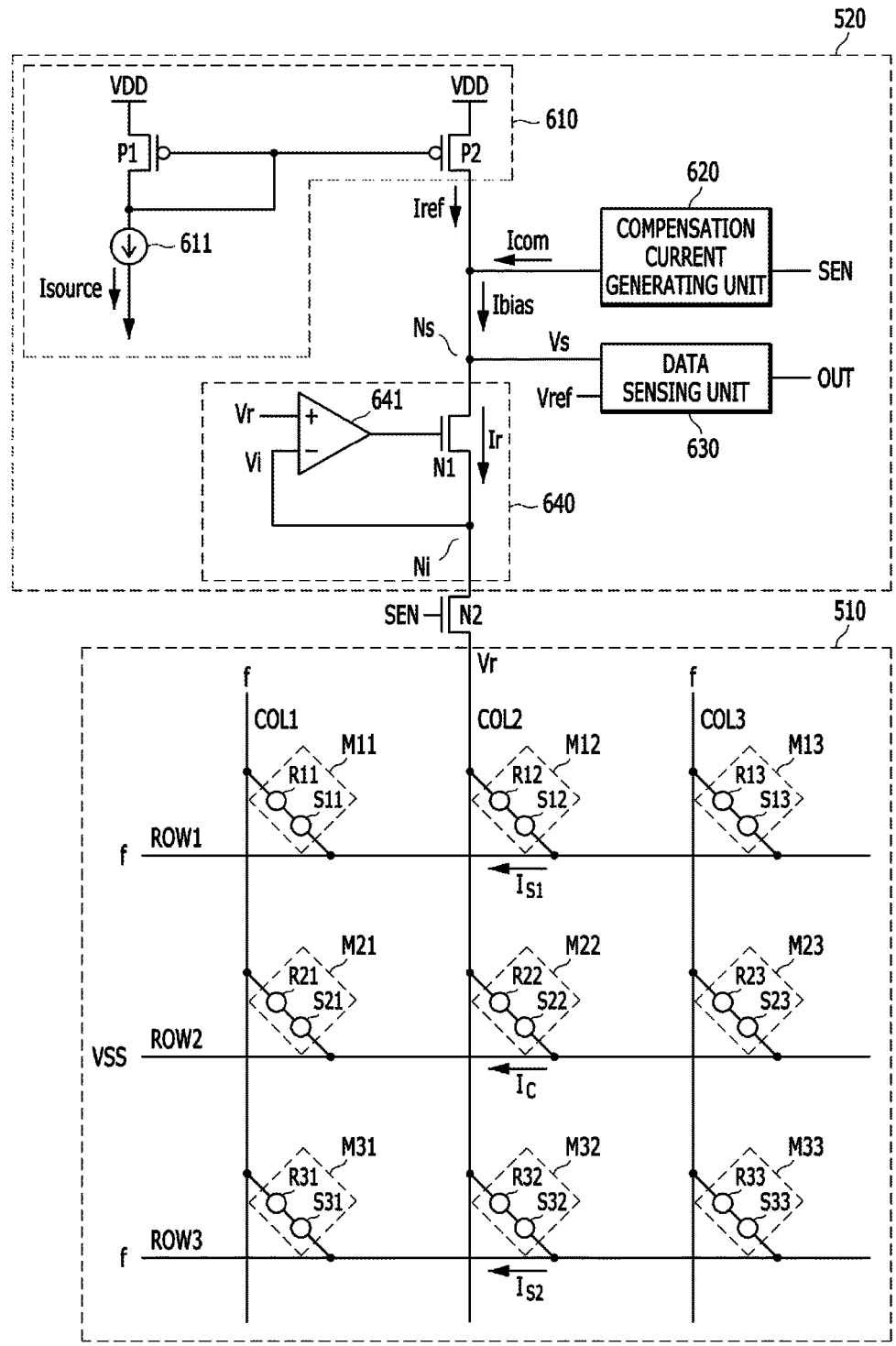
FIG. 6 illustrates a read circuit of FIG. 5, and a cell array of FIG. 5 that includes column lines and row lines to which voltages are applied during a read operation in accordance with an embodiment of the present disclosure.

FIG. 6 illustrates the read circuit 520 and the cell array 510 that includes the column lines COL1-COL3 and row lines ROW1-ROW3 to which voltages are applied during a read operation in accordance with an embodiment of the present disclosure. Hereinafter, for convenience of description, it is assumed that the column line COL2 is a selected column line, the row line ROW2 is a selected row line, and the memory cell M22 is a selected memory cell.

Referring to FIG. 6, a ground voltage VSS may be applied to the selected row line ROW2, and non-selected row lines ROW1 and ROW3 may be floated. The row decoder circuit 530 of FIG. 5 may apply corresponding voltages to the row lines ROW1-ROW3. The selected column line COL2 may be connected to the read circuit 520, and non-selected column lines COL1 and COL3 may be floated. The column decoder circuit 540 of FIG. 5 may connect the selected column line COL2 to the read circuit 520, and causes the non-selected column lines COL1 and COL3 to be floated.

In order to read data stored in the selected memory cell M22, the read circuit 520 may apply a read voltage Vr to the selected column line COL2, and sense a read current Ir that flows into the cell array 510 through a sensing node Ns. The read circuit 520 may include a reference current generating unit 610, a compensation current generating unit 620, a data sensing unit 630, and a read voltage driving unit 640.

The reference current generating unit 610 may generate and supply a reference current Iref to the sensing node Ns. The reference current generating unit 610 may include a current source 611 and transistors P1 and P2. The current source 611 may generate a source current Isource that has the amount substantially equal to that of the reference current Iref. Using a current mirror structure of the transistors P1 and P2, the reference current generating unit 610 may supply, to the sensing node Ns, the reference current Iref that has substantially the same amount as that of the source current Isource.

The compensation current generating unit 620 may generate a compensation current Icom to compensate for a sneak current, and supply the compensation current Icom to the sensing node Ns. The amount of the compensation current Icom may be determined to lead to the greatest (or maximum) read margin in the cell array 510 by performing a test or calibration operation on the semiconductor memory unit 500. The amount of the compensation current Icom may lead to, referring to FIG. 4, the greatest read margin X substantially equal to the difference between the highest point H of the low-resistance-state distribution 401 and the lowest point L of the high-resistance-state distribution 402. In a read operation, the compensation current generating unit 620 supplies the compensation current Icom having the amount corresponding to pre-stored current information. The configuration and operation of the compensation current generating unit 620 will be described below in detail with reference to FIG. 7.

The data sensing unit 630 senses data stored in the selected memory cell M22 by comparing a sense voltage Vs at the sensing node Ns with a reference voltage Vref. When the data sensing unit 630 senses the stored data, a level of the sense voltage Vs may be determined according to a difference between the amount of a bias current Ibias (i.e. a sum of the reference current Iref and the compensation current Icom) supplied to the sensing node Ns and the amount of a read current Ir flowing from the sensing node Ns to the selected column line COL2 through an internal node Ni.

The read voltage driving unit 640 applies a read voltage Vr to the selected column line COL2 so that the read current Ir flows into the selected column line COL2 from the sensing node Ns. The read voltage driving unit 640 may include the internal node Ni connected to the selected column line COL2 in a read operation, a comparator 641 configured to compare the read voltage Vr with a voltage Vi at the internal node Ni, and a transistor N1 connected between the sensing node Ns and the internal node Ni and configured to be turned on or off according to a comparison result of the comparison unit 641. The comparator 641 compares the read voltage Vr and the voltage Vi, turns on the transistor N1 to pull-up the voltage Vi at the internal node Ni when the read voltage Vr is equal to or greater than the voltage Vi, and turns off the transistor N1 when the read voltage Vr is less than the voltage Vi. As a result, the comparator 641 maintains a level of the voltage Vi at the internal node Ni at substantially the same level as that of the read voltage Vr.

Hereinafter, for convenience of description, a read operation of a semiconductor memory unit according to an embodiment will be described on the basis of the aforementioned configuration of FIG. 6.

Before a data sensing operation is performed in a read operation, the sensing node Ns may be precharged during a predetermined period of time so that the sense voltage Vs can have a voltage level (e.g. a voltage level similar to Vref) appropriate for performing the read operation.

When a sense enable signal SEN is activated to start the data sensing operation, a transistor N2 is turned on. The bias current Ibias generated by the reference current generating unit 610 and the compensation current generating unit 620 is supplied to the sensing node Ns. When the transistor N2 is turned on, the read current Ir flows from the sensing node Ns to the selected column line COL2.

Here, the amount of the read current Ir is equal to a sum of a memory current Ic flowing through the selected memory cell M22 to the selected row line ROW2 and sneak currents IS1 and IS2 flowing through the non-selected memory cells M12 and M32 to the non-selected row lines ROW1 and ROW3. In a cell array including a plurality of row and column lines according to an embodiment, a total sum of sneak currents flowing out to non-selected row lines may have substantially a constant value even when a different row line and a different column line are selected. For example, a total sum of sneak currents flowing out through the non-selected column lines COL2 and COL3 when the column line COL1 is selected, a total sum of sneak currents flowing out through the column lines COL1 and COL3 when the column line COL2 is selected, and a total sum of sneak currents flowing out through the column lines COL1 and COL2 when the column line COL3 is selected may all have substantially the same value. When a total sum of sneak currents (or a total sneak current) occurring in one cell array is expressed as "Is", the read current Ir is represented as Ic+Is, where the memory current Ic has a value that varies with a resistance value of a selected memory cell and a read voltage Vr applied across the selected memory cell.

In an embodiment, the amount of the bias current Ibias may be determined to be in a range between the amount of a first read current Ir1 (hereinafter, referred to as a first current amount) when a variable resistance element of the selected memory cell is in a low resistance state and the amount of a second read current Ir1 (hereinafter, referred to as a second current amount) when the variable resistance element of the selected memory cell is in a high resistance state. That is, the amount of the bias current Ibias may be greater than the second current amount Ir1 and less than the first current amount Ir1 (i.e., Ir2<Ibias<Ir1).

Therefore, when the variable resistance element R22 of the selected memory cell M22 is in the low resistance state, the bias current Ibias is less than the read current Ir (i.e., Ibias=Iref+Icom<Ir), and thus the sensing node Ns is discharged to decrease the level of the sense voltage Vs. As a result, the level of the sense voltage Vs becomes lower than the level of the reference voltage Vref after a first predetermined period of time passes. In contrast, when the variable resistance element R22 is in the high resistance state, the bias current Ibias is greater than the read current Ir (i.e., Ibias=Iref+Icom>Ir), and thus the sensing node Ns is charged to increase the level of the sense voltage Vs. As a result, the level of the sense voltage Vs becomes higher than the level of the reference voltage Vref after a second predetermined period of time passes. The data sensing unit 630 compares the level of the sense voltage Vs with the level of the reference voltage Vref after the first or second predetermined period of time passes, and senses data of the selected memory cell M22 based on the comparison result. In an embodiment, when the level of the sense voltage Vs is lower than the level of the reference voltage Vref, the variable resistance element R22 is determined to be in the low resistance state, and thus the selected memory cell M22 is determined to store a logic low value. On the other hand, when the level of the sense voltage Vs is greater than the level of the reference voltage Vref, the variable resistance element R22 is determined to be in the high resistance state, and thus the selected memory cell M22 is determined to store a logic high value.

Here, increasing and decreasing speeds of the level of the sense voltage Vs are determined according to a difference between the amount of the bias current Ibias and the amount of the read current Ir. That is, the level of the sense voltage Vs is rapidly increased or decreased when the difference between the amount of the bias current Ibias and the amount of the read current Ir is large, and the level of the sense voltage Vs is slowly increased or decreased when the difference between the amount of the bias current Ibias and the amount of the read current Ir is small. The low-resistance-state distribution and high-resistance-state distribution of the plurality of memory cells may vary depending on the amount of the bias current Ibias and the amount of the read current Ir. That is, the difference between the amount of the bias current Ibias and the amount of the read current Ir may lead to a change in a read margin and a speed of the read operation.

As described above, the difference between the amount of the bias current Ibias and the amount of the read current Ir leads to a change in the increasing or decreasing speed of the sense voltage Vs. Thus, since the bias current Ibias is determined by the reference current Iref and the compensation current Icom and the reference current Iref is substantially constant, the amount of the compensation current Icom can be adjusted to control the bias current Ibias. As a result, the increasing or decreasing speed of the sense voltage Vs can be adjusted by adjusting the amount of the compensation current Icom. That is, the amount of the compensation current Icom can be adjusted to maximize a read margin of the plurality of memory cells.

Current information related to generating the bias current Ibias (or referred to as bias information) may be determined by performing a test or calibration operation on a semiconductor memory unit. According to an embodiment, in a test or calibration operation, read operations are continuously performed on the plurality of memory cells included in the cell array 510 while changing the amount of the bias current Ibias to detect the amount of the bias current Ibias leading to the greatest read margin. Bias information on the detected amount of the bias current Ibias may be stored in the compensation current generating unit 620. Then, in a subsequent normal read operation, a compensation current Icom corresponding to the detected amount of the bias current Ibias can be immediately generated using the stored bias information and supplied to the sensing node Ns. That is, in the normal read operation subsequent to the test or calibration operation, a read margin can be increased without performing an additional operation such as determining the amount of the bias current Ibias, and thus the compensation current Icom may be generated without a delay.

FIG. 6 shows an embodiment in which the bias current Ibias is supplied using the reference current Iref and the compensation current Icom generated from the two current generating units 610 and 620, respectively, and the amount of the bias current Ibias is controlled by adjusting the amount of the compensation current Icom since the reference current Iref is substantially constant and the compensation current Icom varies depending on the required amount for the bias current Ibias. However, embodiments are not limited thereto. In another embodiment, the bias current Ibias may be supplied by a single current generated from one current generating unit. That is, one current generating unit stores bias information on the detected amount of the bias current Ibias leading to the greatest read margin that is determined through a test or calibration operation, and supplies the bias current Ibias corresponding to the stored bias information.

Figure 7:
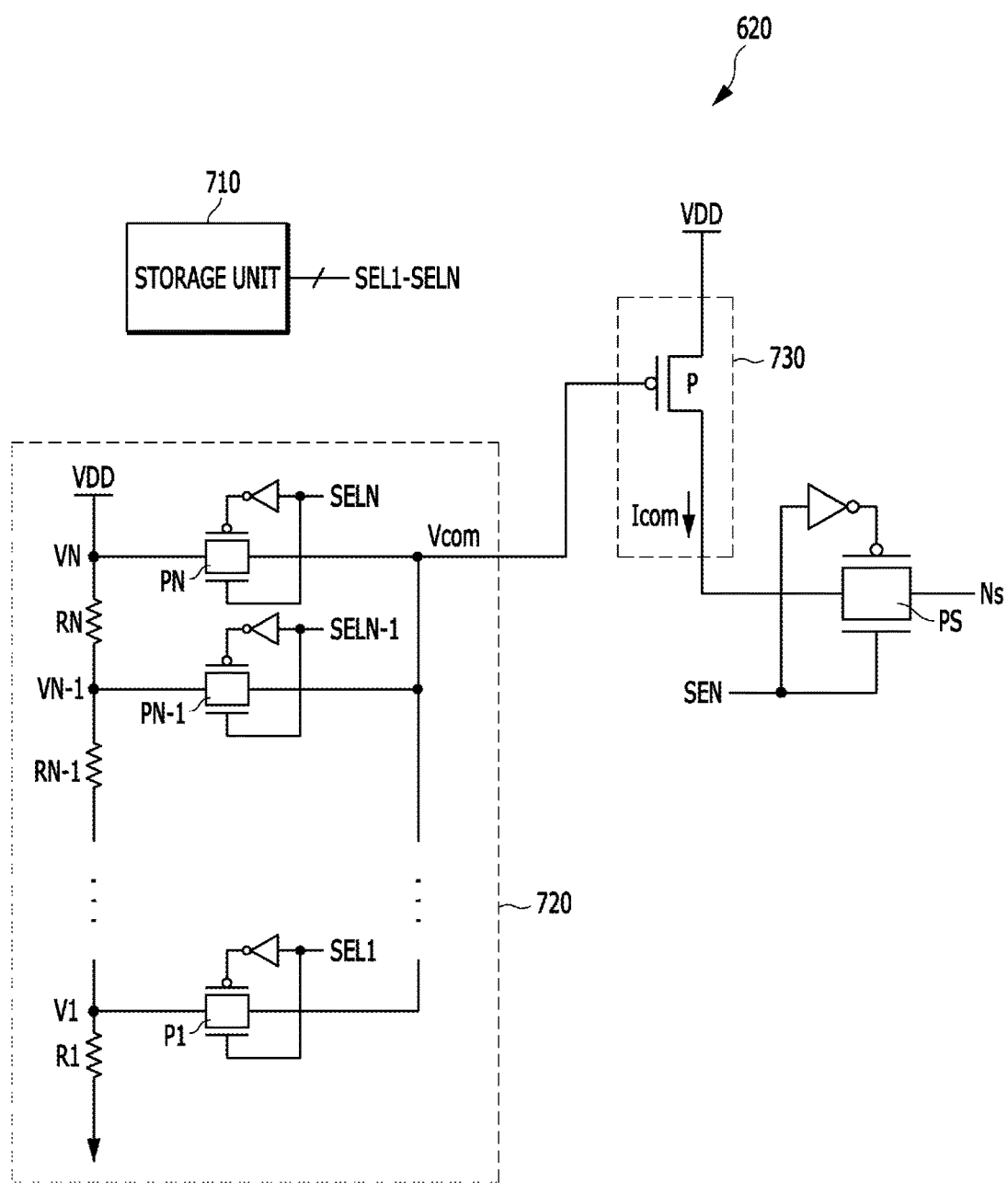
FIG. 7 illustrates a compensation current generation unit of FIG. 6 in accordance with an embodiment of the present disclosure.

FIG. 7 illustrates the configuration of the compensation current generating unit 620 of FIG. 6 in accordance with an embodiment.

Referring to FIG. 7, the compensation current generating unit 620 may include a storage unit (or storage) 710, a voltage generating unit 720, and a current generating unit 730.

The storage 710 may store bias information on the amount of a bias current determined through a test or calibration operation. Such bias information may be used to select one voltage from a plurality of voltages V1-VN that are generated by the voltage generating unit 720. The storage 710 may include a plurality of nonvolatile memory elements to store the bias information. The storage 710 may provide a plurality of selection signals SEL1-SELN (wherein "N" represents a natural number) to select one voltage from the plurality of voltages V1-VN, which are generated by the voltage generating unit 720, based on the bias information.

The voltage generating unit 720 may generate the plurality of voltages V1-VN that have various voltage levels using a power supply voltage VDD, and may select and output one of the voltages V1-VN as a compensation voltage Vcom in response to the plurality of selection signals SEL1-SELN. The voltage generating unit 720 may include a plurality of resistors R1-RN connected in series to each other, and a plurality of pass gates P1-PN each connected in parallel to a corresponding one of the resistors R1-RN. The voltages V1-VN having various voltage levels may be generated at nodes each connecting a corresponding pair of the resistors R1-RN that act as a voltage divider. One of the plurality of selection signals SEL1-SELN is activated, and a voltage corresponding to the activated selection signal may be selected among the generated voltages V1-VN and outputted as the compensation voltage Vcom. Since the plurality of selection signals SEL1-SELN is generated based on the bias information, the voltage level of the compensation voltage Vcom may have a level determined based on the bias information. In an embodiment, if the amount of the bias current Ibias is determined based on the bias information and the amount of the reference current Iref is predetermined to be constant, the amount of the compensation current Icom can be determined by subtracting the amount of the reference current Iref from the amount of the bias current Ibias.

The current generating unit 730 may generate the compensation current Icom that has the amount corresponding to the voltage level of the compensation voltage Vcom. The current generating unit 730 may include a PMOS transistor P for driving the compensation current Icom in response to the compensation voltage Vcom. According to the embodiment shown in FIG. 7, the amount of the compensation current Icom may decrease as the level of the compensation voltage Vcom increases, and the amount of the compensation current Icom may increase as the level of the compensation voltage Vcom decreases. In another embodiment, if a different type of transistor (e.g., an NMOS transistor) is used instead of the PMOS transistor P, the amount of the compensation current Icom is proportional to the level of the compensation voltage Vcom.

The compensation current Icom generated by the current generating unit 730 may be supplied to a sensing node Ns via a pass gate PS, which is turned on when a sense enable signal SEN is activated to perform a data sensing operation.

According to the embodiment shown in FIG. 7, to generate a compensation current Icom having a relatively large amount, bias information to select a voltage Vcom having a low level suitable for such a compensation current Icom may be generated as a result of a test or calibration operation, stored in the storage 710, and then used to generate the compensation current Icom having the relatively large amount. In contrast, to generate a compensation current Icom having a relatively small amount, bias information to select a voltage Vcom having a high level suitable for such a compensation current Icom may be generated as a result of the test or calibration operation, stored in the storage 710, and then used to generate the compensation current Icom having the relatively small amount.

Although the embodiment of the compensation current generating unit 620 has been described above with reference to FIG. 7, embodiments are not limited thereto. A person of skilled in the art in light of the teachings and disclosures herein would recognize that a variety of circuits, which can store information (e.g., bias information) indicating the amount of the bias current Ibias or the amount of the compensation current Icom and control the amount of the compensation current Icom according to the bias information, may be used to implement the compensation current generating unit 620.

Figure 8:
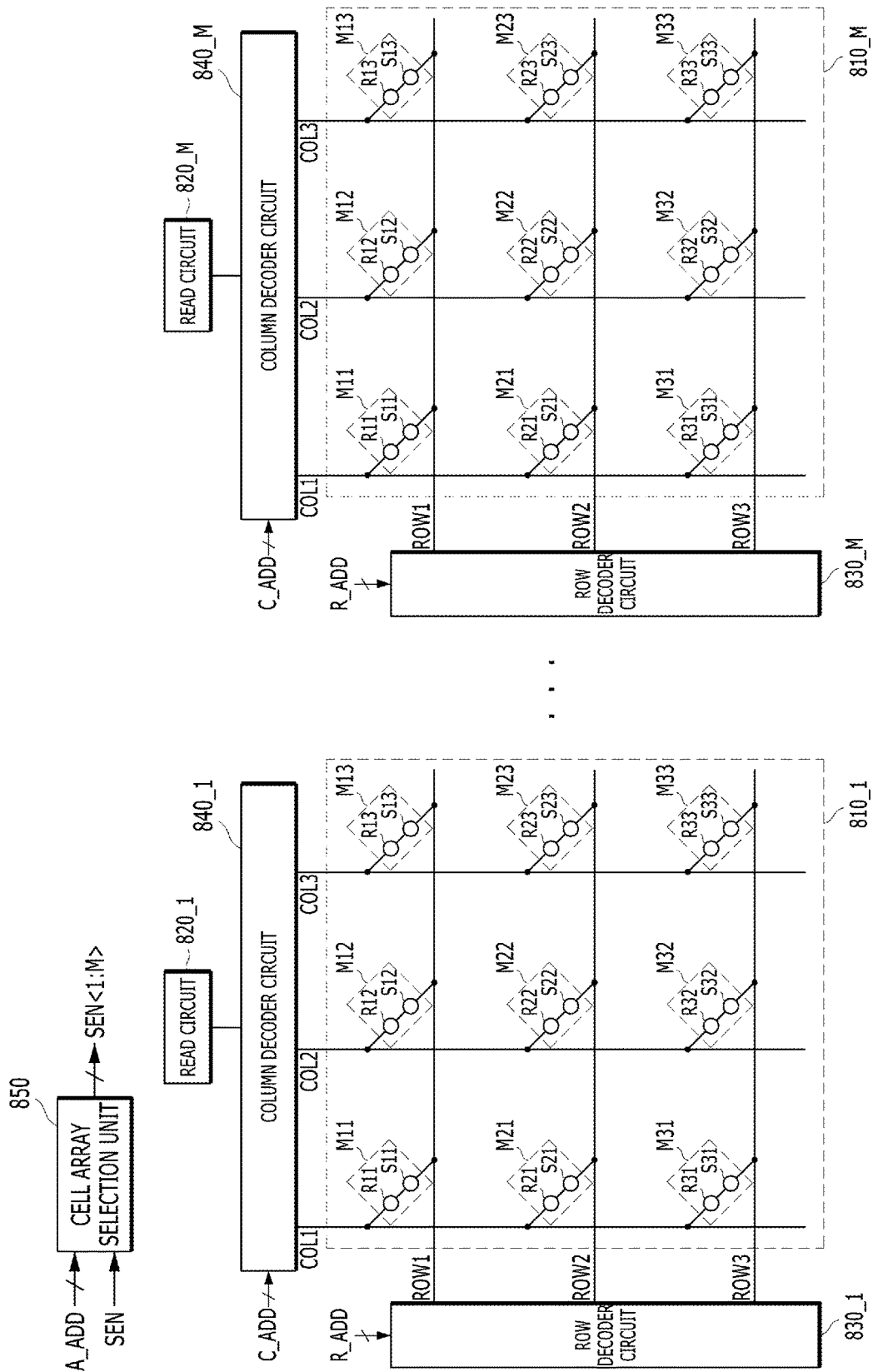
FIG. 8 illustrates a semiconductor memory device that includes a plurality of cell arrays in accordance with an embodiment of the present disclosure.

FIG. 8 illustrates a semiconductor memory unit that includes a plurality of cell arrays 810_1-810_M (hereinafter "M" represents a natural number) in accordance with an embodiment of the present disclosure.

Referring to FIG. 8, the semiconductor memory unit may include the plurality of cell arrays 810_1-810_M, a plurality of read circuits 820_1-820_M, a plurality of row decoder circuits 830_1-830_M, a plurality of column decoder circuits 840_1-840_M, and a cell array selection unit 850.

In a read operation, a cell array selected by an array address A_ADD and components corresponding to the selected cell array can perform the aforementioned read operation. The cell array selection unit 850 can activate a sense enable signal corresponding to one cell array selected by the array address A_ADD among sense enable signals SEN<1:M>, which correspond to the cell arrays 810_1-810_M, respectively.

The amounts of sneak currents occurring in the respective cell arrays may be different from each other, and thus values of the amounts of bias currents leading to the greatest read margins with respect to the respective cell arrays may be also different from each other. Bias information on these amounts of the bias currents, which has been obtained through a test or calibration operation, can be stored in the respective read circuits 820_1-820_M, so that the amount of a bias current generated in a read operation may vary according to a selected one of the cell arrays 810_1-810_M.

When one of the cell arrays 810_1-810_M is selected, a corresponding one of the read circuits 820_1-820_M, a corresponding one of the row decoder circuits 830_1-830_M, and a corresponding one of the column decoder circuits 840_1-840_M may operate in substantially the same manners as those of the read circuit 520, the row decoder circuit 530, and the column decoder circuit 540, as described above with reference to FIGS. 5 to 7.

Since the semiconductor memory unit shown in FIG. 8 performs a read operation using a bias current leading to the greatest read margin with respect to each selected cell array, read characteristics thereof can be improved. In addition, since bias information on the bias current is determined through a test or calibration operation and then stored in a storage prior to performing a read operation, the read operation can be performed using the stored bias information without a delay.

Figure 9:
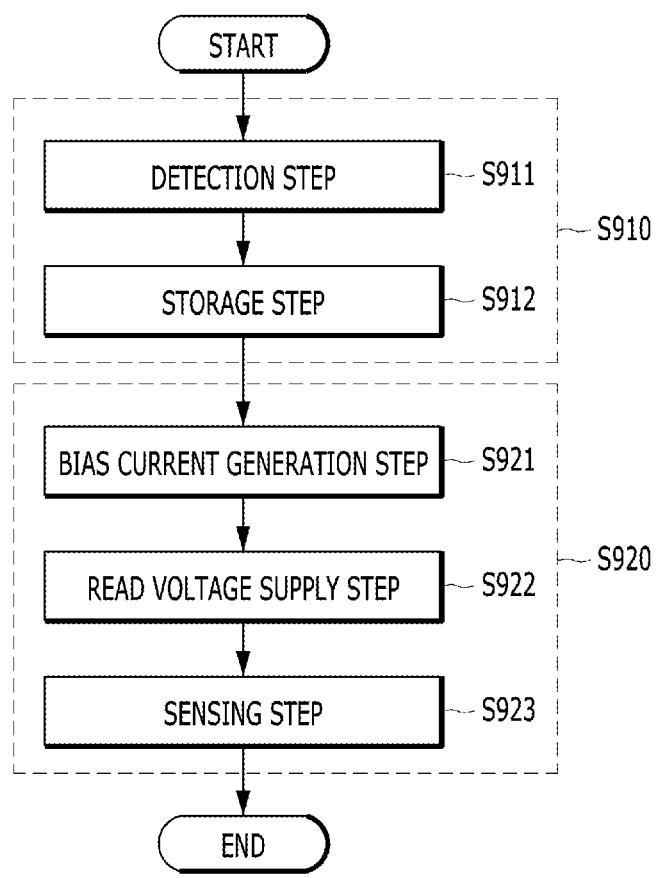
FIG. 9 is a flowchart illustrating an operating method of an electronic device in accordance with an embodiment of the present disclosure.

FIG. 9 is a flowchart illustrating an operating method of an electronic device in accordance with an embodiment of the present disclosure.

Referring to FIG. 9, the operating method of the electronic device may include a test step S910 and a read step S920. At the test step S910, a test or calibration operation is performed on a selected cell array of a semiconductor memory unit in the electronic device to detect a bias current leading to the greatest read margin and bias information indicating the detected bias current is stored in the electronic device. At the read step S920, a normal read operation is performed on the semiconductor memory unit using the bias information.

The test step S910 may include a detection step S911 and a storage step S912. At the detection step S911, memory cells included in the selected cell array are selected in a sequence and read operations are performed on the memory cells while changing the amount of a bias current. As a result, the amount of the bias current leading to the greatest read margin with respect to the selected cell array is detected. At the storage step S912, bias information indicating the detected bias current is stored in the storage of the electronic device so that a read operation at S920 can be performed using the stored bias information. In an embodiment, the bias information can be stored in nonvolatile memory elements of the semiconductor memory unit, so that the bias information is retained even when power is not supplied to the semiconductor memory unit.

The read step S920 may include a bias current generation step S921, a read current supply step S922, and a sensing step S923. At the bias current generation step S921, a bias current having the amount corresponding to the stored bias information is generated and supplied to a sensing node. At the read voltage supply step S922, a read voltage is applied to a selected column line, and a read current flows through the sensing node according to a resistance state of a variable resistance element in a selected memory cell. At the sensing step S923, the sensing node is charged or discharged to increase or decrease a sense voltage at the sensing node, respectively, according to a difference between the bias current and the read current. Data stored in the selected memory cell is sensed by comparing the sense voltage of the sensing node with a reference voltage after a predetermined period of time has elapsed.

Although the flowchart of FIG. 9 illustrates the steps S921, S922, and S923 are performed in a particular order, embodiments are not limited thereto. In another embodiment, some or all portions of the steps S921, S922, and S923 may be performed at substantially the same time.

Embodiments of the present disclosure can increase a read margin in a read operation by compensating for a sneak current occurring in the read operation using a bias current detected in a test or calibration operation.

In addition, embodiments of the present disclose can reduce a delay in a read speed by determining and storing bias current information related to the compensation of a sneak current prior to performing a normal read operation.

Although various embodiments have been described for illustrative purposes, it will be apparent to those skilled in the art that various changes and modifications are possible.

The above and other memory circuits or semiconductor devices based on the disclosed technology can be used in a range of devices or systems. FIGS. 10-14 provide some examples of devices or systems that can implement the memory circuits disclosed herein.

Figure 10:
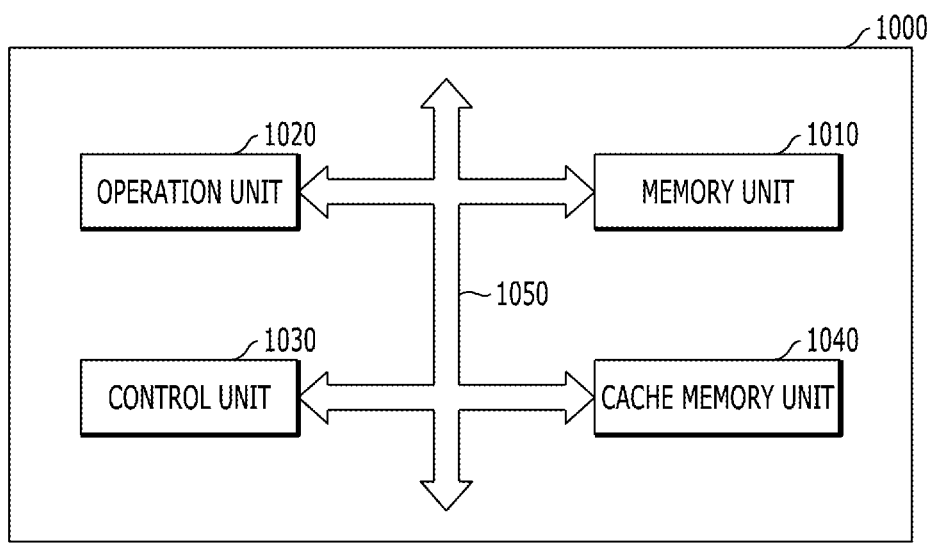
FIG. 10 shows an example of a configuration diagram of a microprocessor implementing memory circuitry based on the disclosed technology.

FIG. 10 shows an example of a configuration diagram of a microprocessor based on another implementation of the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the memory unit 1010 may be increased without delaying a read operation. Consequently, performance of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
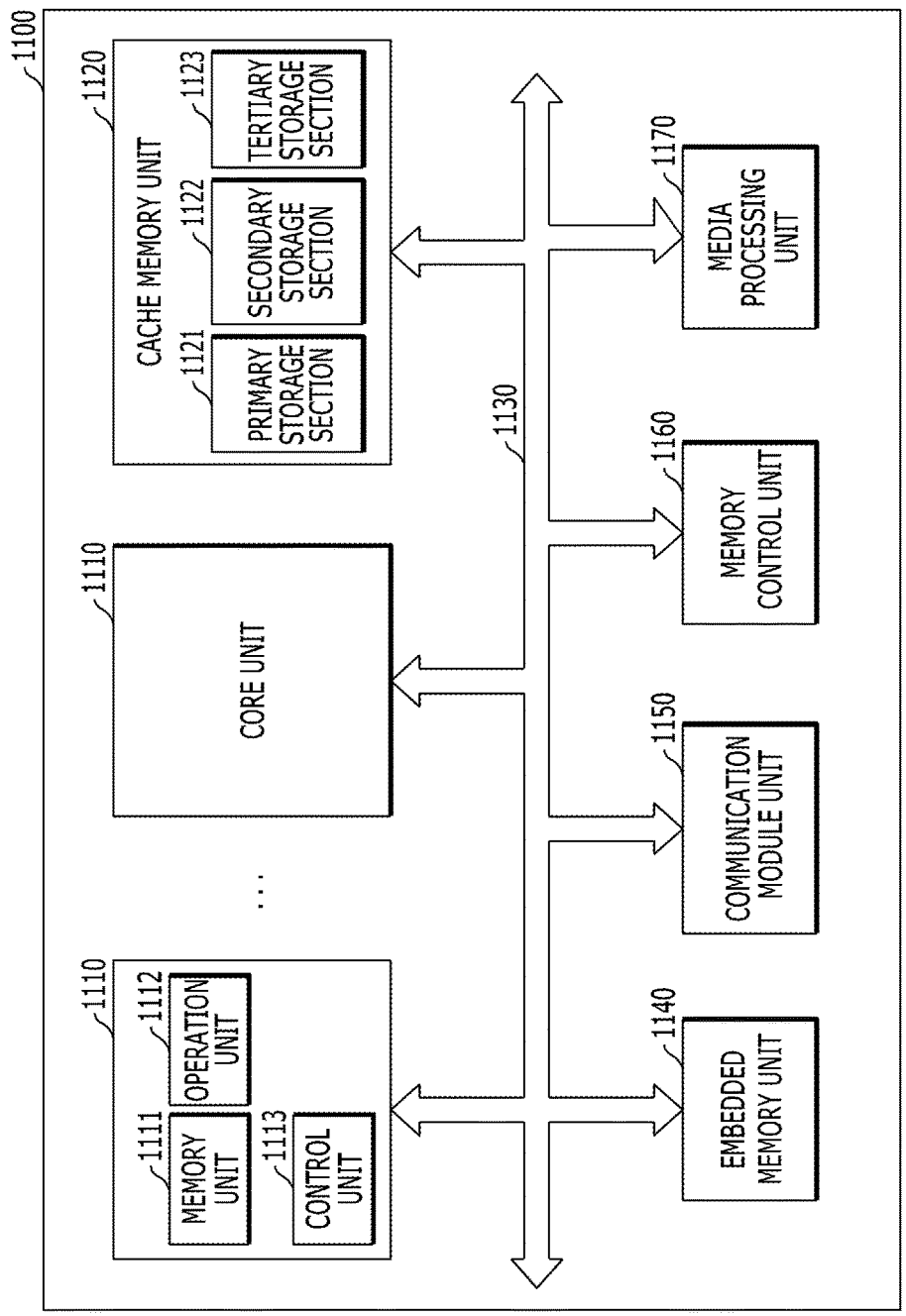
FIG. 11 shows an example of a configuration diagram of a processor implementing memory circuitry based on the disclosed technology.

FIG. 11 is a configuration diagram of a processor based on another implementation of the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the cache memory unit 1120 may be increased without delaying a read operation. Consequently, performance of the processor 1100 may be improved.

Although it was shown in FIG. 11 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
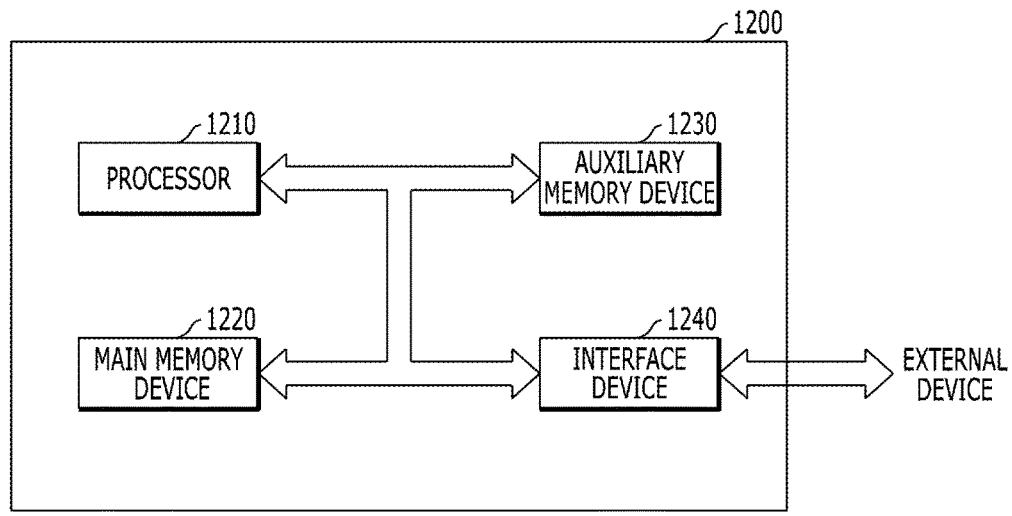
FIG. 12 shows an example of a configuration diagram of a system implementing memory circuitry based on the disclosed technology.

FIG. 12 is a configuration diagram of a system based on another implementation of the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the main memory device 1220 may be increased without delaying a read operation. Consequently, performance of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the auxiliary memory device 1230 may be increased without delaying a read operation. Consequently, performance of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
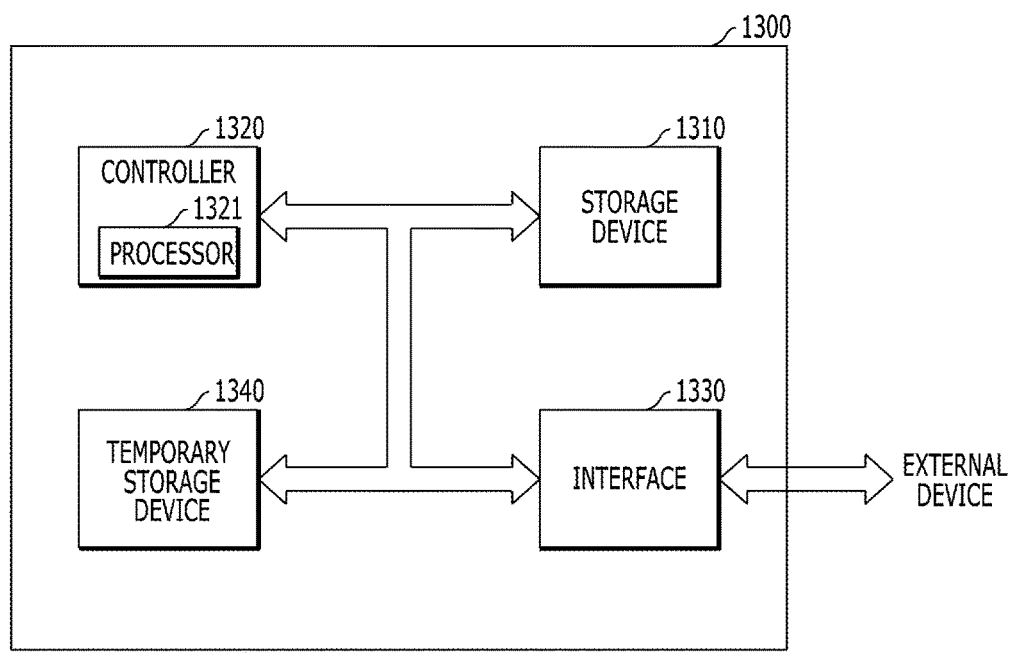
FIG. 13 shows an example of a configuration diagram of a data storage system implementing memory circuitry based on the disclosed technology.

FIG. 13 is a configuration diagram of a data storage system based on another implementation of the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system. For example, the temporary storage device 1340 may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the temporary storage device 1340 may be increased without delaying a read operation. Consequently, performance of the data storage system 1300 may be improved.

Figure 14:
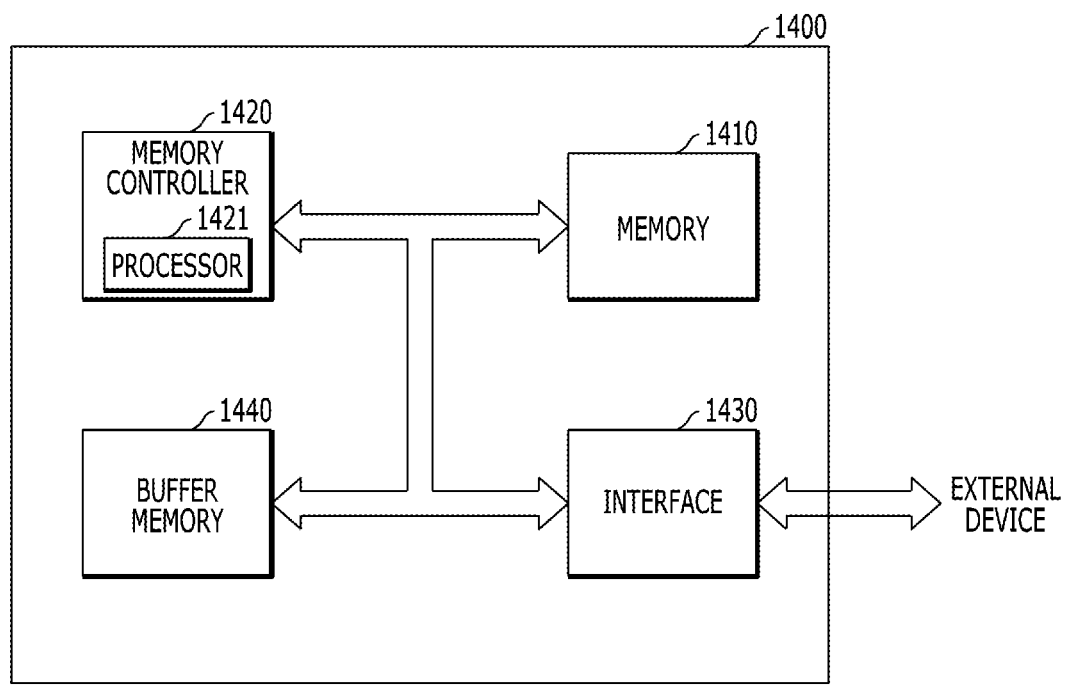
FIG. 14 shows an example of a configuration diagram of a memory system implementing memory circuitry based on the disclosed technology.

FIG. 14 is a configuration diagram of a memory system based on another implementation of the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the memory 1410 may be increased without delaying a read operation. Consequently, performance of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include: a cell array including a plurality of resistive memory cells which are arranged in a plurality of column lines and a plurality of row lines; and a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node. The bias information is determined and stored in the semiconductor memory unit before the read operation starts. Through this, a read margin of the buffer memory 1440 may be increased without delaying a read operation. Consequently, performance of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory unit, the semiconductor memory unit comprising:
    a cell array including a plurality of resistive memory cells which are arranged in a plurality of column lines and a plurality of row lines; and
    a read circuit suitable for, in a read operation, generating a bias current based on bias information, supplying the bias current to a sensing node, supplying a read current from the sensing node to a column line selected from among the plurality of column lines, and sensing data stored in a selected memory cell coupled to the selected column line using a voltage level at the sensing node,
    wherein the bias information is determined and stored in the semiconductor memory unit before the read operation starts, and
    wherein the read circuit comprises:
        a first current generating unit suitable for generating and supplying a reference current to the sensing node; and
        a second current generating unit suitable for storing the bias information, generating a compensation current according to the bias information, and supplying the compensation current to the sensing node, the compensation current compensating for a sneak current flowing through one or more non-selected memory cells,
    wherein the second current generating unit comprises:
        a storage suitable for storing the bias information and providing a plurality of selection signals, the plurality of selection signals including first and second selection signals;
        a voltage generating unit suitable for generating a compensation voltage having a level corresponding to the bias information; and
        a current generating unit suitable for generating the compensation current having an amount corresponding to the level of the compensation voltage, and
    wherein the voltage generating unit comprises:
        a resistor having a first end and a second end;

a first pass gate connected to the first end of the resistor and transmitting a first voltage at the first end as the compensation voltage in response to the first selection signal; and a second pass gate connected to the second end of the resistor and transmitting a second voltage at the second end as the compensation voltage in response to the second selection signal.

2. The electronic device of claim 1, wherein each of the plurality of resistive memory cells comprises:

a variable resistance element suitable for having a high resistance state or a low resistance state according to a logic value of data stored in the variable resistance element; and a selection element coupled in series to the variable resistance element.

3. The electronic device of claim 1, wherein each of the plurality of resistive memory cells is coupled to a corresponding column line among the plurality of column lines and a corresponding row line among the plurality of row lines.

4. The electronic device of claim 1, wherein the read circuit further comprises:

a sensing unit suitable for sensing the data of the selected memory cell using the voltage level at the sensing node; and a read voltage driving unit suitable for receiving the bias current from the sensing node and applying the read current to the selected column line, wherein the bias current is a sum of the reference current and the compensation current, and wherein the first and second current generating units generate the bias current having an amount that leads to a maximum read margin in the cell array.

5. The electronic device of claim 1, wherein the bias information indicates an amount of the bias current that leads to a maximum read margin in the cell array.

6. The electronic device of claim 1, wherein the storage comprises a plurality of nonvolatile memory elements storing the bias information.

7. The electronic device of claim 4, wherein the read voltage driving unit comprises:

an internal node coupled to the selected column line in the read operation;

a comparator suitable for comparing a read voltage with a voltage at the internal node; and a transistor coupled to and disposed between the sensing node and the internal node, and suitable for being controlled by a comparison result of the comparator to apply the read current to the selected column line.

8. The electronic device according to claim 1, further comprising a microprocessor which includes:

a control unit that is configured to receive a signal including a command from an outside of the microprocessor, and performs extracting, decoding of the command, or controlling input or output of a signal of microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

9. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

10. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

11. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

12. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

13. An electronic device including a semiconductor memory unit, the semiconductor memory unit comprising:
a plurality of cell arrays, wherein each cell array includes a plurality of resistive memory cells which are arranged in a plurality of column lines and a plurality of row lines; and
a plurality of read circuits each suitable for, in a read operation, generating a bias current based on bias information, supplying the bias current to a sensing node when a corresponding cell array is selected from the plurality of cell arrays, supplying a read current from the sensing node to a column line selected from among the plurality of column lines, and sensing data stored in a selected memory cell coupled to the selected column line using a voltage level at the sensing node,
wherein the bias information is determined and stored in the semiconductor memory unit before the read operation starts, and
wherein each of the plurality of read circuits comprises:
a first current generating unit suitable for generating and supplying a reference current to the sensing node; and
a second current generating unit suitable for storing the bias information, generating a compensation current according to the bias information, and supplying the compensation current to the sensing node, the compensation current compensating for a sneak current flowing through one or more non-selected memory cells,
wherein the second current generating unit comprises:
a storage suitable for storing the bias information and providing a plurality of selection signals, the plurality of selection signals including first and second selection signals;
a voltage generating unit suitable for generating a compensation voltage having a level corresponding to the bias information; and
a current generating unit suitable for generating the compensation current having an amount corresponding to the level of the compensation voltage, and
wherein the voltage generating unit comprises:
a resistor having a first end and a second end;
a first pass gate connected to the first end of the resistor and transmitting a first voltage at the first end as the compensation voltage in response to the first selection signal; and
a second pass gate connected to the second end of the resistor and transmitting a second voltage at the second end as the compensation voltage in response to the second selection signal.

14. The electronic device of claim 13, wherein each of the plurality of resistive memory cells comprises:
a variable resistance element suitable for having a high resistance state or a low resistance state according to a logic value of data stored in the variable resistance element; and
a selection element coupled in series to the variable resistance element.

15. The electronic device of claim 13, wherein each of the plurality of resistive memory cells is coupled to a corresponding column line among the plurality of column lines and a corresponding row line among the plurality of row lines.

16. The electronic device of claim 13, wherein each of the plurality of read circuits further comprises:

a data sensing unit suitable for sensing the data of the selected memory cell by comparing the voltage level at the sensing node with a voltage level of a reference voltage; and
a read voltage driving unit suitable for receiving the bias current from the sensing node and applying the read current to the selected column line,
wherein the bias current is a sum of the reference current and the compensation current, and
wherein the first and second current generating units generate the bias current having an amount that leads to a maximum read margin in the selected cell array.

17. The electronic device of claim 13, wherein the bias information indicates an amount of the bias current that leads to a maximum read margin in the selected cell array among the plurality of cell arrays.

18. The electronic device according to claim 13, further comprising a microprocessor which includes:
a control unit that is configured to receive a signal including a command from an outside of the microprocessor, and performs extracting, decoding of the command, or controlling input or output of a signal of microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the variable resistance element is part of the memory unit in the microprocessor.

19. The electronic device according to claim 13, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

20. The electronic device according to claim 13, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the variable resistance element is part of the auxiliary memory device or the main memory device in the processing system.

21. The electronic device according to claim 13, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory unit that includes the variable resistance element is part of the storage device or the temporary storage device in the data storage system.

22. The electronic device according to claim 13, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory unit that includes the variable resistance element is part of the memory or the buffer memory in the memory system.

23. An operating method for an electronic device comprising a semiconductor memory unit, the semiconductor memory unit comprising a cell array including a plurality of resistive memory cells which are arranged in a plurality of column lines and a plurality of row lines, the method comprising:
- detecting an amount of a first bias current that leads to a maximum read margin in the cell array by performing a plurality of read operations while changing the amount of the first bias current;
- storing bias information indicative of the detected amount of the first bias current;
- generating, in a read operation, a second bias current based on the stored bias information and supplying the second bias current to a sensing node;
- supplying a read current from the sensing node to the selected column line in response to a read voltage; and
- sensing data stored in a selected memory cell among the plurality of memory cells based on a voltage level at the sensing node,
- wherein generating the second bias current comprises:
  - generating a reference current that is substantially constant; and
  - generating a compensation current that varies depending on the bias information to compensate for a sneak current flowing through one or more non-selected memory cells,
- wherein generating the compensation current comprises:
  - generating a plurality of selection signals based on the bias information, the plurality of selection signals including first and second selection signals;
  - generating a plurality of voltages using a power supply voltage and a plurality of resistors, the plurality of resistors coupled in series to each other;
  - selecting one of the plurality of voltages using a plurality of pass gates in response to the plurality of selection signals, adjacent pass gates of the plurality of pass gates being respectively connected to a first end and a second end of a corresponding one of the plurality of resistors;
  - outputting the selected voltage as a compensation voltage; and
  - generating the compensation current in response to the compensation voltage, and
- wherein the selection signals are selectively activated based on the bias information.

24. The method of claim 23, wherein the second bias current has an amount that leads to a maximum read margin in the cell array.

25. The method of claim 23, wherein the second bias current is a sum of the reference current and the compensation current.

26. The method of claim 23, wherein the compensation current has an amount that is inversely proportional to a level of the compensation voltage.

* * * * *